United States Patent
Yamauchi et al.

(10) Patent No.: US 11,634,670 B2
(45) Date of Patent: Apr. 25, 2023

(54) CLEANING AGENT FOR SEMICONDUCTOR COMPONENT, AND USE THEREOF

(71) Applicant: TOAGOSEI CO., LTD., Tokyo (JP)

(72) Inventors: Ryosuke Yamauchi, Nagoya (JP); Akihiro Gotou, Nagoya (JP)

(73) Assignee: TOAGOSEI CO. LTD., Tokyo (JP)

( * ) Notice: Subject to any disclaimer, the term of this patent is extended or adjusted under 35 U.S.C. 154(b) by 0 days.

(21) Appl. No.: 17/293,321

(22) PCT Filed: Oct. 30, 2019

(86) PCT No.: PCT/JP2019/042576
§ 371 (c)(1),
(2) Date: May 12, 2021

(87) PCT Pub. No.: WO2020/100593
PCT Pub. Date: May 22, 2020

(65) Prior Publication Data
US 2021/0403836 A1 Dec. 30, 2021

(30) Foreign Application Priority Data
Nov. 16, 2018 (JP) .............................. JP2018-215817

(51) Int. Cl.
| | | |
|---|---|---|
| *C11D 7/34* | (2006.01) | |
| *C11D 11/00* | (2006.01) | |
| *H01L 21/02* | (2006.01) | |
| *H01L 21/306* | (2006.01) | |
| *C11D 3/34* | (2006.01) | |

(52) U.S. Cl.
CPC .................. *C11D 7/34* (2013.01); *C11D 3/34* (2013.01); *C11D 11/0047* (2013.01); *H01L 21/02057* (2013.01); *H01L 21/30625* (2013.01)

(58) Field of Classification Search
CPC .................................................. C11D 11/0047
USPC ....................................................... 510/175
See application file for complete search history.

(56) References Cited

U.S. PATENT DOCUMENTS

| | | | |
|---|---|---|---|
| 6,440,856 B1* | 8/2002 | Bessho ..................... B08B 3/08 |
| | | | 438/692 |
| 2011/0245127 A1 | 10/2011 | Suzuki et al. | |
| 2014/0311379 A1 | 10/2014 | Ryokawa et al. | |
| 2019/0093051 A1* | 3/2019 | Yoshizaki ......... H01L 21/02065 |
| 2019/0203027 A1* | 7/2019 | Chen ................. H01L 21/02065 |
| 2019/0227440 A1 | 7/2019 | Kamimura | |
| 2019/0390139 A1* | 12/2019 | Tamboli ............... C11D 3/2082 |
| 2020/0024547 A1* | 1/2020 | Ishida ............... H01L 21/02057 |
| 2021/0009739 A1* | 1/2021 | Matsumoto ........... C08F 220/06 |
| 2021/0130751 A1* | 5/2021 | Yoshizaki .............. C11D 7/266 |
| 2021/0157241 A1 | 5/2021 | Kamimura | |

FOREIGN PATENT DOCUMENTS

| | | |
|---|---|---|
| JP | 2001-064679 A | 3/2001 |
| JP | 2010-163609 A | 7/2010 |
| JP | 2013-138178 A | 7/2013 |
| JP | 2015-125791 A | 7/2015 |
| JP | 2018-064093 A | 4/2018 |
| TW | 201028466 A | 8/2010 |
| TW | 201819585 A | 6/2018 |
| WO | 2018/062470 A1 | 4/2018 |

OTHER PUBLICATIONS

May 24, 2022 Office Action issued in Japanese Application No. 2020-556005.
Dec. 17, 2019 International Search Report issued in International Patent Application No. PCT/JP2019/042576.
Dec. 17, 2019 Written Opinion issued in International Patent Application No. PCT/JP2019/042576.
Jan. 13, 2023 Office Action issued in Korean Application No. 10-2021-7018345.
Feb. 9, 2023 Office Action issued in TW Application 06757003.6.

\* cited by examiner

*Primary Examiner* — Gregory E Webb
(74) *Attorney, Agent, or Firm* — Oliff PLC

(57) ABSTRACT

A semiconductor cleaning agent containing a sulfonic acid group-containing polymer, wherein a content of at least one metal selected from the group consisting of Na, Al, K, Ca and Fe is 0.7 ppm or less.

16 Claims, No Drawings

CLEANING AGENT FOR SEMICONDUCTOR COMPONENT, AND USE THEREOF

TECHNICAL FIELD

This Description relates to a cleaning agent for semiconductor components, and use thereof.

CROSS-REFERENCE TO RELATED APPLICATIONS

This application is a related application of Japanese Patent Application No. 2018-215817 filed on Nov. 16, 2018 and claims claim priority to this Japanese patent application, the entire contents of which are incorporated herein by reference. Also, this application is a related application of Japanese Patent Application No. 2018-187676 filed on Oct. 2, 2018 and Japanese Patent Application No. 2019-75704 filed on October 2, and claim priority to these Japanese patent applications, the entire contents of which are incorporated herein by reference.

BACKGROUND ART

Polymers having sulfonic acid groups or sulfonate salt groups (hereinafter also called sulfonic acid polymers) are used industrially in a wide range of applications, including dispersants for papermaking and coagulants, thickeners and cleaning agents.

For example, a cleaning agent for semiconductor components having a sulfonic acid polymer as a principal component is disclosed (Patent Literature 1), and the literature states that metal impurities remaining on semiconductor components after chemical mechanical polishing (CMP) can be removed with this cleaning agent.

CITATION LIST

Patent Literature 1: Japanese Patent Application Publication No. 2001-64679

SUMMARY

In recent years, in the semiconductor field, there has been increased demand for reductions in impurities contaminating semiconductor devices, and a high degree of purity is also required of chemicals used in a device manufacturing process, such as polishing compositions and cleaning agents. Although the cleaning agent in the Patent Literature 1 is described to be able to remove metal impurities derived from polishing particles remaining on semiconductor components after CMP, the metal impurities contained in the cleaning agent itself are not considered.

The present Description provides a cleaning agent for semiconductor components, with which higher-quality semiconductor components can be obtained.

Solution to Technical Problem

As a result of various studies on impurities remaining on semiconductor components after cleaning with cleaning agents, the inventors have discovered that metal components contained in the cleaning agents themselves can cause an increase in metal impurities on the semiconductor components after cleaning. The present Description provides following means based on these findings.

[1] A semiconductor component cleaning agent, comprising:
a sulfonic acid group-containing polymer,
wherein a content of at least one kind of metal selected from the group consisting of Na, Al, K, Ca and Fe is not more than 0.7 ppm.
[2] The semiconductor component cleaning agent according to [1], wherein the at least one kind of metal includes Na.
[3] The semiconductor component cleaning agent according to [2], wherein the at least one kind of metal further includes Fe.
[4] The semiconductor component cleaning agent according to [3], wherein the at least one kind of metal further includes Ca.
[5] The semiconductor component cleaning agent according to [4], wherein the at least one kind of metal further includes K.
[6] The semiconductor component cleaning agent according to [5], wherein the at least one kind of metal further includes Al.
[7] The semiconductor component cleaning agent according to any of one of [1] to [6], wherein the sulfonic acid group-containing polymer has a structural unit derived from 2-acrylamido-2-methylpropane sulfonic acid or a salt thereof.
[8] The semiconductor component cleaning agent according to [7], wherein the structural unit derived from 2-acrylamido-2-methylpropane sulfonic acid or a salt thereof constitutes at least 0 mass % and not more than 100 mass % of total structural units of the sulfonic acid group-containing polymer.
[9] The semiconductor component cleaning agent according to any one of [1] to [8], wherein a structural unit derived from a carboxy group-containing monomer constitutes at least 0 mass % and not more than 30 mass % of total structural units of the sulfonic acid group-containing polymer.
[10] The semiconductor component cleaning agent according to any one of [1] to [9], which is a cleaning agent for a cleaning semiconductor component after polishing.
[11] A method for cleaning a semiconductor component, comprising:
cleaning said semiconductor component by using the cleaning agent according to any one of [1] to [9].
[12] A method for cleaning, comprising:
cleaning a semiconductor component after polishing by using the cleaning agent according to any one of [1] to [9].
[13] A method for manufacturing a semiconductor component, comprising:
cleaning a surface of said semiconductor component by using the cleaning agent according to any one of [1] to [9].
[14] A method for manufacturing a semiconductor component, comprising:
cleaning a surface of said semiconductor component after polishing by using the cleaning agent according to any one of [1] to [9].

DESCRIPTION OF EMBODIMENTS

This Description provides a cleaning agent for semiconductor components. The cleaning agent for semiconductor components disclosed in this Description (hereinafter also called "the cleaning agent") contains a sulfonic acid group-containing polymer, and because the content of specific kinds of metals in the cleaning agent is not more than 0.7 ppm, it is possible to reduce these specific kinds of metals (that is, metal impurities) remaining on the surface of semiconductor components after cleaning when the cleaning agent is used to wash semiconductor components, and easily obtain semiconductor components with reduced levels of contamination. Consequently, with the cleaning agent of the invention it is possible to obtain high-quality semiconductor components without the need for a further step to remove metal impurities after cleaning or the like.

The cleaning method and semiconductor component manufacturing method (hereinafter also called "the manufacturing method") disclosed in this Description can produce the same effects as those of the cleaning agent.

In this Description, "(meth)acrylic" means acrylic and/or methacrylic, "(meth)acrylate" means acrylate and/or methacrylate, "(meth)acrylamide" means acrylamide and/or methacrylamide, and "(meth)allyl" means allyl and/or methallyl.

In this Description, a "polymer" means a polymer obtained by polymerizing one or two or more kinds of monomer. For example, a "polymer" may take the form of various liquids containing the polymer, such as a polymerization reaction solution after completion of polymerization, a polymer solution containing the polymerization reaction solution for purposes of storage, or a product sold as a polymer solution. These various liquids containing the polymer may contain the "polymer", a polymerization reaction solution of the polymer, and in some cases unreacted monomers and residual components such as initiation agents used in the reaction.

In this Description, a "cleaning agent" is an agent used to clean a surface to be cleaned, and is an agent containing as an active ingredient a polymer having a structural unit derived from a monomer having a sulfonic acid group or sulfonate salt group. The cleaning agent may for example be mixed with a necessary medium as appropriate and used to actually clean a surface to be cleaned. Examples of the medium that is mixed with the cleaning agent include water, mixed media of water and alcohols, and mixed media containing water and organic solvents that are compatible with water.

Typical and non-limiting specific examples of the disclosures of the Description are explained in detail below with reference to the drawings. These detailed explanations are aimed simply at showing preferred examples of the disclosures of the Description in detail so that they can be implemented by a person skilled in the art, and are not intended to limit the scope of the disclosures of the Description. The additional features and disclosures disclosed below may be used separately or together with other features and teachings to provide a further improved cleaning agent for semiconductor components, and use thereof.

The combinations of features and steps disclosed in the detailed explanations below are not essential for implementing the disclosures of the Description in the broadest sense, and are presented only for purposes of explaining typical examples of the disclosures of the Description in particular. Moreover, the various features of the typical examples above and below and the various features described in the independent and dependent claims do not have to be combined in the same way as in the specific examples described here, or in the listed order, when providing addition useful embodiments of the disclosures of the Description.

All features described in the Description and/or Claims are intended as individual and independent disclosures restricting the initial disclosures and the claimed matter specifying the teaching, separately from the constitution of features described in the Examples and/or Claims. Moreover, all descriptions of numerical ranges and groups or sets are intended to include intermediate configurations for purposes of restricting the initial disclosures and the claimed matter specifying the teaching.

<Cleaning Agent for Semiconductor Components>

The cleaning agent may contain a sulfonic acid group-containing polymer. The sulfonic acid group-containing polymer (hereinafter also called "the polymer") contained in the cleaning agent may be in the form of various polymers including copolymers such as random copolymers and various block copolymers, without any particular limitations, and the molecular weight and molecular weight distribution thereof and the like are also not particularly limited.

Furthermore, the content of specific kinds of metals in the cleaning agent may be at or below a predetermined amount. The metal content of the cleaning agent is discussed below.

(Sulfonic acid group-containing polymer) The polymer is a polymer having a structural unit derived from a monomer containing a sulfonic acid group or sulfonate salt group (hereinafter also called the "sulfonic acid (salt) group-containing monomer"). The sulfonic acid (salt) group-containing monomer may be an unsaturated monomer having sulfonic acid or a sulfonate salt, and also having a polymerizable unsaturated group such as a vinyl group. Examples of such monomers or monomer salts include isoprene sulfonic acid, (meth)acrylamido-2-methylpropane sulfonic acid, styrene sulfonic acid, α-methylstyrene sulfonic acid, (meth)allyl sulfonic acid, vinyl sulfonic acid, isoamylene sulfonic acid, unsaturated (meth)allyl ether monomers such as 2-hydroxy-3-(meth)allyloxy-1-propane sulfonic acid, sulfoethyl (meth)acrylate, conjugated diene sulfonic acids such as 2-methyl-1,3-butadiene-1-sulfonic acid, and 2-hydroxy-3-acrylamidopropane sulfonic acid and salts of these.

One of these or a combination of two or more may be used as the sulfonic acid (salt) group-containing monomer. Of these, a (meth)acrylamido-2-methylpropane sulfonic acid such as 2-acrylamido-2-methylpropane sulfonic acid or a salt thereof may be used from the standpoint of superior polymerizability and the like.

The salt in the sulfonic acid (salt) group-containing monomer is not particularly limited, and common examples include alkali metal salts of potassium and the like; alkali earth metal salts of calcium, magnesium and the like; ammonia; ammonium salts, including quaternary ammonium hydroxides such as tetramethylammonium hydroxide, tetraethylammonium hydroxide and tetrabutylammonium hydroxide; and organic amine salts, including salts of alkylamines such as methylamine, ethylamine, propylamine, dimethylamine, diethylamine, triethylamine, butylamine, dibutylamine and tributylamine, alcohol amines such as monoethanolamine, triethanolamine and diisopropanolamine, polyamines such as ethylenediamine, hexamethylenediamine, diethylenetriamine, triethylenetetramine, triethylpentamine and tetraethylpentamine, and morpholine, piperidine and the like. As discussed below, in this Description a non-metal salt or a metal salt of a metal that is not a target of restriction is preferred considering the metal content to be restricted in the cleaning agent. Ammonia, ammonium salts and various organic amine salts are more preferred.

The polymer may contain a polymer having a structural unit derived from a monomer containing a carboxy group or salt thereof (hereinafter called a "carboxy (salt) group-containing monomer"). The carboxy (salt) group-containing monomer may be an unsaturated monomer having a carboxy (salt) group and also having a polymerizable unsaturated group such as a vinyl group. Examples of this monomer include carboxy group-containing vinyl compounds such as (meth)acrylic acid, itaconic acid, maleic acid, fumaric acid, crotonic acid and 2-carboxyethyl (meth)acrylate; unsaturated acid anhydrides such as maleic anhydride, itaconic anhydride and citraconic anhydride; half-ester compounds of these unsaturated acid anhydrides with alkyl alcohols; and salts of these and the like, and one or two or more of these may be used. Of these, (meth)acrylic acid, maleic acid and maleic anhydride are particularly desirable for imparting sufficient hydrophilicity to the resulting polymer, and acrylic acid is especially preferred.

In a monomer composition for obtaining the polymer, the total mass amount of the sulfonic acid (salt) group-containing monomer relative to the total mass amount of the monomer components is for example at least 1 mass %, or for example at least 2 mass %, or for example at least 5 mass %, or for example at least 10 mass %, or for example at least 30 mass %, or for example at least 60 mass %, or for example at least 90 mass %, or for example at least 95 mass %, or for example at least 99 mass %, or for example 100 mass %. The total mass amount of these may also be for example not more than 99 mass %, or for example not more than 95 mass %, or for example not more than 90 mass %, or for example not more than 60 mass %, or for example not more than 30 mass %, or for example not more than 10 mass %, or for example not more than 5 mass %, or for example not more than 2 mass %. These upper and lower limits of the total mass amount may be set according to the object to be polished, the cleaning performance and the like, but for example from 1 mass % to 100 mass % is suitable for reducing surface defects and organic residues, and for example from 10 mass % to 100 mass % is more desirable, or for example from 20 mass % to 100 mass % is even more desirable, and for example from 50 mass % to 100 mass % is still more desirable, and for example from 95 mass % to 100 mass % is yet more desirable.

In this Description, when stipulating the mass % of a certain kind of monomer relative to the total mass amount of a monomer composition for obtaining one kind of polymer, this mass % represents the mass % of structural units derived from the certain kind of monomer in a polymer obtained by polymerizing that monomer composition. Similarly, when stipulating the mass % of another specific monomer relative to the total mass amount of a specific monomer in a monomer composition, this mass % represents the mass % of structural units derived from the other specific monomer relative to the total mass amount of structural units derived from the specific monomer in a polymer obtained by polymerizing the monomer composition.

In a monomer composition for obtaining the polymer, the total mass amount of the carboxy (salt) group-containing monomer as a percentage of the total mass amount of the monomer composition may be for example at least 0 mass %, or for example at least 1 mass %, or for example at least 2 mass %, or for example at least 5 mass %, or for example at least 10 mass %, or for example at least 30 mass %, or for example at least 60 mass %, or for example at least 90 mass %, or for example at least 95 mass %, or for example at least 99 mass %. The total mass amount thereof may also be for example not more than 99 mass %, or for example not more than 90 mass %, or for example not more than 60 mass %, or for example not more than 30 mass %, or for example not more than 10 mass %, or for example not more than 5 mass %, or for example not more than 2 mass %, or for example not more than 1 mass %, or for example 0 mass %. These upper and lower limits of the total mass amount may be set according to the object to be polished, the cleaning performance and the like, but for example from 0 mass % to 90 mass % is suitable for reducing surface defects and organic residues.

The ratio of the sulfonic acid (salt) group-containing monomer in the sulfonic acid (salt) group-containing monomer and the carboxy (salt) group-containing monomer as a percentage of the combined mass amount of these monomers may be for example at least 10 mass %, or for example at least 30 mass %, or for example at least 50 mass %, or for example at least 70 mass %, or for example at least 90 mass %, or for example at least 95 mass %, or for example at least 97 mass %, or for example at least 98 mass % or for example at least 99 mass %, or for example 100 mass %. The ratio of the sulfonic acid (salt) group-containing monomer may also be for example not more than 99 mass %, or for example not more than 98 mass %, or for example not more than 97 mass %, or for example not more than 95 mass %, or for example not more than 90 mass %, or for example not more than 70 mass %, or for example not more than 50 mass %, or for example not more than 30 mass %, or for example not more than 20 mass %. These upper and lower limits of the total mass amount may be set according to the object to be polished, the cleaning performance and the like, but for example from 1 mass % to 100 mass % is suitable for reducing surface defects and organic residues, and for example from 10 mass % to 100 mass % is more desirable, and for example from 20 mass % to 100 mass % is even more desirable, and for example from 50 mass % to 100 mass % is still more desirable, and for example from 95 mass % to 100 mass % is yet more desirable.

(Other components) In addition to the above monomers, a structural unit derived from a monomer that is copolymerizable with these monomers may be included in the polymer to the extent that this does not detract from the effects of the polymer. This monomer is not particularly limited, but examples include amide group-containing vinyl monomers, N-vinyl lactam monomers, hydroxyl group-containing vinyl monomers, (meth)acrylic acid alkyl ester monomers, aromatic vinyl monomers, amino group-containing vinyl monomers, polyoxyalkylene group-containing vinyl monomers, alkoxy group-containing vinyl monomers, cyano group-containing vinyl monomers, vinyl ether monomers, vinyl ester monomers, conjugated dienes and the like. One of these alone or a combination of two or more may be used.

Examples of the amide group-containing vinyl monomers include (meth)acrylamide; N-monoalkyl substituted (meth)acrylamides, such as N-methyl (meth)acrylamide, N-ethyl (meth)acrylamide, N-propyl (meth)acrylamide, N-isopropyl (meth)acrylamide, N-butyl (meth)acrylamide, N-isobutyl (meth)acrylamide, N-tert-butyl (meth)acrylamide, N-hexyl (meth)acrylamide, N-heptyl (meth)acrylamide, N-octyl (meth)acrylamide, 2-ethylhexyl (meth)acrylamide, N-dodecyl (meth)acrylamide and N-octadecyl (meth)acrylamide; N-monoalkylol (meth)acrylamides, such as N-methylol (meth)acrylamide, N-ethylol (meth)acrylamide and N-propylol (meth)acrylamide; N,N-dialkyl substituted (meth)acrylamides, such as N,N-dimethyl (meth)acrylamide, N,N-diethyl (meth)acrylamide, N,N-dipropyl (meth)acrylamide, N,N-diisopropyl (meth)acrylamide, N,N-dibutyl (meth)acrylamide, N,N-diisobutyl (meth)acrylamide, N,N-di-tert-butyl (meth)acrylamide, N,N-diheptyl (meth)acrylamide, N,N-dioctyl (meth)acrylamide, N,N-di-tert-octyl (meth)acrylamide, N,N-didodecyl (meth)acrylamide and N,N-dioctadecyl (meth)acrylamide; N,N-dialkylaminoalkyl (meth)acrylamides, such as N,N-dimethylaminoethyl (meth)acrylamide, N,N-diethylaminoethyl (meth)acrylamide, N,N-dimethylaminopropyl (meth)acrylamide and N,N- diethylaminopropyl (meth)acrylamide; N-(meth)acryloyl cyclic amide compounds such as N-(meth)acryloyl morpholine, N-(meth)acryloyl thiomorpholine, N-(meth)acryloyl piperidine and N-(meth)acryloyl pyrrolidine; and N-vinyl acetamide, N-vinylpropanamide, N-vinylbutyramide and the like. One or two or more of these may be used.

Examples of the N-vinyl lactam monomers include N-vinyl pyrrolidone, N-vinyl piperidone, N-vinyl morpholinone, N-vinyl caprolactam, N-vinyl-1,3-oxazine-2-one, N-vinyl-3,5-morpholinedione and the like, and one or two or more of these may be used.

Examples of the hydroxyl group-containing vinyl monomers include 2-hydroxyethyl (meth)acrylate, 2-hydroxypropyl (meth)acrylate, 4-hydroxybutyl (meth)acrylate, polyethylene glycol mono (meth)acrylate and the like, and one or two or more of these may be used.

Examples of the (meth)acrylic acid alkyl ester monomers include methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, n-pentyl (meth)acrylate, isoamyl (meth)acrylate, n-hexyl (meth)acrylate, 2-methylpentyl (meth)acrylate, n-octyl (meth)acrylate, 2-ethylhexyl (meth)acrylate, n-decyl (meth)acrylate, n-dodecyl (meth)acrylate, n-octadecyl (meth)acrylate and the like. One of these alone or a combination of two or more may be used.

Examples of the aromatic vinyl monomers include styrene, 2-methylstyrene, 3-methylstyrene, 4-methylstyrene, α-methylstyrene, 2,4-dimethylstyrene, 2,4-diisopropylstyrene, 4-tert-butylstyrene, tert-butoxystyrene, vinyl toluene, vinyl naphthalene, halogenated styrenes and the like. One of these alone or a combination of two or more may be used.

Examples of the amino group-containing vinyl monomers include dimethylaminomethyl (meth)acrylate, diethylaminomethyl (meth)acrylate, 2-dimethylaminoethyl (meth)acrylate, 2-diethylaminoethyl (meth)acrylate, 2-(di-n-propylamino) ethyl (meth)acrylate, 2-dimethylaminopropyl (meth)acrylate, 2-diethylaminopropyl (meth)acrylate, 2-(di-n-propylamino) propyl (meth)acrylate, 3-dimethylaminopropyl (meth)acrylate, 3-diethylaminopropyl (meth)acrylate, 3-(di-n-propylamino) propyl (meth)acrylate and the like. One of these alone or a combination of two or more may be used.

Examples of the polyoxyalkylene group-containing vinyl monomers include (meth)acrylic acid esters of alcohols having polyoxyethylene groups and/or polyoxypropylene groups and the like. One of these alone or a combination of two or more may be used.

Examples of the alkoxy group-containing vinyl compounds include 2-methoxyethyl (meth)acrylate, 2-ethoxyethyl (meth)acrylate, 2-(n-propoxy) ethyl (meth)acrylate, 2-(n-butoxy)ethyl (meth)acrylate, 3-methoxypropyl (meth)acrylate, 3-ethoxypropyl (meth)acrylate, 2-(n-propoxy) propyl (meth)acrylate, 2-(n-butoxy) propyl (meth)acrylate and the like. One of these alone or a combination of two or more may be used.

Examples of the cyano group-containing vinyl monomers include cyanomethyl (meth)acrylate, 1-cyanoethyl (meth)acrylate, 2-cyanoethyl (meth)acrylate, 1-cyanopropyl (meth)acrylate, 2-cyanopropyl (meth)acrylate, 3-cyanopropyl (meth)acrylate, 4-cyanobutyl (meth)acrylate, 6-cyanohexyl (meth)acrylate, 2-ethyl-6-cyanohexyl (meth)acrylate, 8-cyanooctyl (meth)acrylate, acrylonitrile, methacrylonitrile, ethacrylonitrile and the like. One of these alone or a combination of two or more may be used.

Examples of the vinyl ether monomers include vinyl methyl ether, vinyl ethyl ether, vinyl n-butyl ether, vinyl phenyl ether, vinyl cyclohexyl ether and the like. One of these alone or a combination of two or more may be used.

Examples of the vinyl ester monomers include vinyl formate, vinyl acetate, vinyl propionate and the like. One of these alone or a combination of two or more may be used.

Examples of the conjugated dienes include 1,3-butadiene, isoprene, 2,3-dimethyl-1,3-butadiene, 1,3-pentadiene, 2-methyl-1,3-pentadiene, 1,3-hexadiene, 4,5-diethyl-1,3-octadiene, 3-butyl-1,3-octadiene, chloroprene and the like. One of these alone or a combination of two or more may be used.

Other examples include maleimide compounds such as maleimide, N-methylmaleimide, N-butylmaleimide, N-phenylmaleimide and N-cyclohexylmaleimide; maleic acid ester compounds; itaconic acid ester compounds; and N-vinyl heterocyclic compounds such as vinyl pyridine and the like.

The amount of this other monomer used above is not particularly limited but is from 0 mass % to 50 mass %, or for example from 0 mass % to 40 mass %, or for example from 0 mass % to 30 mass % of the total mass amount of the monomer composition used for one kind of polymer used for the polymer of the invention.

(Weight-Average Molecular Weight)

The weight-average molecular weight (Mw) of the polymer is not particularly limited but is for example from 1,000 to 1,000,000, or for example from 2,000 to 500,000, or for example from 3,000 to 100,000 from the standpoint of manufacturing stability. For purposes of use as a semiconductor cleaning agent, it is for example from 1,000 to 1,000,000 or for example from 2,000 to 100,000 or for example from 5,000 to 50,000 from the standpoint of cleaning performance. The weight-average molecular weight can be measured by gel permeation chromatography (GPC) using sodium polyacrylate or the like as a standard substance.

The concentration of the sulfonic acid (salt) group-containing polymer contained in the cleaning agent is not particularly limited but is preferably in the range of from 0.01 mass % to 40 mass %. When the lower limit of the concentration is at least 0.01 mass %, effective cleaning performance is ensured, which is desirable for reducing surface defects and organic residues. The lower limit is more preferably at least 0.1 mass %, or still more preferably at least 0.5 mass %, or yet more preferably at least 1.0 mass %. If the upper limit is not more than 40 mass %, moreover, a cleaning agent with low viscosity and good handling properties can be obtained. The upper limit may also be not more than 30 mass %, or not more than 20 mass %. Furthermore, an upper limit of not more than 10 mass % is desirable for obtaining good corrosion resistance.

(Metal content) The content of specific kinds of metals in the cleaning agent may be kept at or below a predetermined amount. The specific kinds of metals differ according to the type of polymer, but examples include Na, Al, K, Ca and Fe. These metals are metal species that may be eluted from wetted elements (such as the polymer reaction vessel) used in the polymer manufacturing process as described below and are also metal species that contaminate semiconductor components such as wafers. That is, these metals are metal species whose contamination sources have been overlooked in the past and are also metals that are to remove. By keeping the content of at least one of these metals at or below a predetermined content in the cleaning agent, it is possible to favorably reduce residual metal impurities on the surface of semiconductor components after cleaning when the cleaning agent is used to clean semiconductor components. Preferably this applies two of these metals, or more preferably to three, or still more preferably to four, or most preferably to all of them.

The metals are for example at least Na, or for example Na and Fe, or for example Na, Fe and Ca, or for example Na, Fe, Ca and K, or for example Na, Fe, Ca, K and Al.

The content of at least one selected from these five metals in the cleaning agent may be not more than 0.7 ppm for example. This is because if the content is not more than 0.7 ppm, it is possible to provide better cleaning performance of semiconductor components than in the past. The content is for example not more than 0.5 ppm, or for example not more than 0.4 ppm, or for example not more than 0.3 ppm, or for example not more than 0.2 ppm, or for example not more than 0.1 ppm, or for example not more than 0.05 ppm, or for example not more than 0.01 ppm. The metal content in the cleaning agent can be measured using the methods described below for measuring metal elements in dilute sulfuric acid.

Upper and lower limits may also be set for the contents of Na, Al, K, Ca and Fe individually. The upper limit of the content of Na in the cleaning agent is for example 0.4 ppm, or for example 0.2 ppm, or for example 0.1 ppm, or for example 0.05 ppm, or for example 0.04 ppm, or for example 0.02 ppm. The upper limit of the content of Al is for example 0.1 ppm, or for example 0.05 ppm, or for example 0.02 ppm, or for example 0.01 ppm. The upper limit of the content of K is for example 0.1 ppm, or for example 0.08 ppm, or for example 0.05 ppm, or for example 0.03 ppm, or for example 0.02 ppm, or for example 0.01 ppm. The upper limit of the Ca content is for example 0.3 ppm, or for example 0.2 ppm, or for example 0.1 ppm, or for example 0.08 ppm, or for example 0.06 ppm, or for example 0.05 ppm, or for example 0.04 ppm, or for example 0.03 ppm, or for example 0.02 ppm. Finally, the upper limit of the Fe content is for example 0.3 ppm, or for example 0.25 ppm, or for example 0.2 ppm, or for example 0.1 ppm.

In addition to the above metals, the contents of Mg, Cr, Ni, Zn and Ta may also be restricted in the cleaning agent. These are metals that are known to contaminate semiconductor components, although the likelihood that they will contaminate the cleaning agent from the wetted elements is low. In the cleaning agent, the content of at least one selected from these metals may be not more than 0.7 ppm. This content may also be for example not more than 0.5 ppm, or for example not more than 0.3 ppm, or for example not more than 0.2 ppm, or for example not more than 0.1 ppm.

The contents of Mn, Cu, Ti, Co, Zr, Ag, Sn, W and Pb may also be restricted in the cleaning agent. These are metals that are known to contaminate semiconductor components, although the likelihood that they will contaminate the cleaning agent from the wetted elements is low. In the cleaning agent, the content of at least one selected from these metals may be not more than 0.7 ppm. This content may also be for example not more than 0.5 ppm, or not more than 0.5 ppm, or for example not more than 0.3 ppm, or for example not more than 0.2 ppm, or for example not more than 0.1 ppm.

(Semiconductor components to be cleaned) The cleaning agent may be used to clean semiconductor components of various materials and shapes. The material constituting a semiconductor component to be cleaned with the cleaning agent is not particularly limited, but may be silicon, glass, ceramic or the like. The surface material of a semiconductor component to be cleaned with the cleaning agent is not particularly limited but may be for example single crystal silicon, polycrystalline silicon, amorphous silicon, thermal silicon oxide film, non-doped silicate glass film, phosphorus-doped silicate glass film, boron-doped silicate glass film, phosphorus and boron-doped silicate glass film, tetraethyl orthosilicate (TEOS) film, plasma CVD oxide film, silicon nitride film, silicon carbide film, silicon oxycarbide film, silicon oxynitride film, silicon carbonitride film, silicon oxycarbonitride film or the like. Other examples include metal, glass, quartz, crystal, ceramic and the like. The surface to be cleaned may be constituted from one of these materials alone, or from two or more materials that have been patterned or laminated with a particular distribution.

Method for Manufacturing Cleaning Agent for Semiconductor Components>

(Polymerization step) The method for manufacturing the cleaning agent for semiconductor components (hereinafter also called the "cleaning agent manufacturing method") may comprise a polymerization step in which one or two or more monomers or monomer salts are polymerized as discussed above. In the polymerization step, a (co)polymer may be manufactured for example by performing a polymerization reaction with one or two or more monomers or monomer salts in the presence of a polymerization initiator at a reaction temperature of normally 20° C. to 200° C. or preferably 40° C. to 150° C. for 0.1 to 20 hours or preferably from 1 to 15 hours. For example, in one formulation the monomers used in polymerization may be added sequentially to perform polymerization. Sequential polymerization here means that the monomer components are loaded into the polymerization system within a predetermined time period either in fixed amounts per unit time or in different added amounts.

The polymerization method in the polymerization step is not particularly limited, but a solution polymerization method is preferred. The polymer can be obtained as a uniform solution by solution polymerization.

Water or a mixture of water and an organic solvent miscible with water or the like may be used as the polymerization solvent for solution polymerization. The specific organic solvent is not particularly limited as long as it is miscible with water, but examples include tetrahydrofuran, 1,4-dioxane, dimethylformamide and alcohols.

A known polymerization initiator may be used in the polymerization step, and a radical polymerization initiator is particularly desirable. Examples of the radical polymerization initiator include persulfate salts such as sodium persulfate, potassium persulfate and ammonium persulfate, hydroperoxides such as t-butyl hydroperoxide, water-soluble peroxides such as hydrogen peroxide, ketone peroxides such as methyl ethyl ketone peroxide and cyclohexanone peroxide, dialkyl peroxides such as di-t-butyl peroxide and t-butyl cumyl peroxide, oil-soluble peroxides including peroxyesters such as t-butyl peroxypivalate and t-hexyl peroxypivalate, and azo compounds such as 2,2'-azobisisobutyronitrile, 2,2'-azobis(2,4-dimethylvaleronitrile), 2,2'-azobis(2-methylbutyronitrile), 2,2'-azobis[2-methyl-N-(2-hydroxyethyl) propionamide], 2,2'-azobis[2-(2-imidazolin-2-yl) propane] disulfite dihydrate, 2,2'-azobis[N-(2-carboxyethyl)-2-methylpropionamidin] tetrahydrate and the like. One kind of radical polymerization initiator alone or a combination of two or more kinds may be used.

Considering the metal content of the cleaning agent to be manufactured, it is desirable to use an initiator that intrinsically contains no metal components or an initiator in which the content of metal components has been restricted in the polymerization step. For example, ammonium persulfate, peroxides and azo compounds are preferred from this perspective. The use ratio of the radical polymerization initiator is not particularly limited but is preferably from 0.01 to 10 mass %, or more preferably from 0.05 to 7 mass %, or still more preferably from 0.1 to 4 mass % based on the total weight of all monomers constituting the water-soluble polymer as a whole.

A chain transfer agent may be added appropriately to the polymerization system to adjust the molecular weight as necessary. Examples of the chain transfer agent include mercaptoacetic acid, mercaptopropionic acid, 2-propanethiol, 2-mercaptoethanol, 3-mercapto-1,2-propanediol and the like.

Depending on the molecular weight, molecular weight distribution and the like of the polymer to be synthesized, a living polymerization method such as reversible addition-fragmentation chain transfer (RAFT) polymerization, nitroxide-mediated polymerization (NMP), atom transfer radical polymerization (ATRP) or organotellurium-mediated living radical polymerization (TERP) may be adopted as the polymerization method in the polymerization step.

In RAFT polymerization methods, controlled polymerization progresses via a reversible chain transfer reaction in the presence of a specifical polymerization inhibitor (RAFT agent) and an ordinary free radical polymerization initiator. The molecular weight of the polymer can be regulated by adjusting the preparation ratios of the monomers and the RAFT agent. The RAFT agent is not particularly limited, but examples include various known RAFT agents, including as dithioester compounds, xanthate compounds, trithiocarbonate compounds, dithiocarbamate compounds and the like.

The use ratio of the RAFT agent may be adjusted appropriately according to the types of monomers used and the type of RAFT agent, but preferably the use ratio is from 0.01 to 5.0 mass %, or more preferably from 0.05 to 3.0 mass %, or still more preferably from 0.1 to 2.0 mass % based on the total weight of all monomers constituting the water-soluble polymer as a whole.

In NMP methods, a specific alkoxyamine compound or the like containing nitroxides is used as a living radical polymerization initiator, and polymerization progresses via nitroxide radicals derived from the initiator. The type of nitroxide radical used is not particular limited, but from the perspective of polymerization control when polymerizing monomers such as acrylamide derivatives containing acrylates and acrylamides, it is desirable to use a compound represented by general formula (1) as a nitroxide compound.

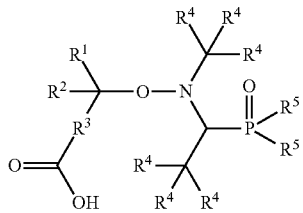

[C1]

{In formula (1), $R^1$ is a $C_{1-2}$ alkyl group or hydrogen atom, $R^2$ is a $C_{1-2}$ alkyl group or nitrile group, $R^3$ is —$(CH_2)m$- (in which m is 0 to 2), and $R^4$ and $R^5$ are $C_{1-4}$ alkyl groups.}

(Degree of neutralization of acid groups in monomers and polymer) In the process of manufacturing the sulfonic acid group-containing polymer, monomers having acid groups such as non-oxidizing acid groups and the acids of polymers having structural units derived from these monomers may be in salt form, or in the form of free acids. In the former case, the salts are as described above. When a free acid monomer is used in the polymerization process, a base may be added to form a polymer salt after the polymerization step as part of the polymerization process. Another salt may also be substituted by ion exchange.

When a monomer having an acid group or a polymer having a structural unit derived from such a monomer is converted into a salt, the degree of neutralization of the acid group is not particularly limited, but in order to control elution and the like of metal components from elements that contact the liquid during the manufacturing process (such as reaction vessels and storage vessels, hereinafter also called "wetted elements"), it is desirable to thoroughly neutralize the acid groups such as non-oxidizing acid groups of the monomer or polymer so that the pH of the process liquid does not fall too low. When the reaction vessel is made of stainless steel for example, a pH of over 1, or for example at least 2, or for example at least 3, or for example at least 4, or for example at least 5 is desirable. Thus, considering the ultimate pH, the degree of neutralization may be for example from 90 mol % to 150 mol %, or for example from 90 mol % to 140 mol %, or for example from 90 mol % to 130 mol %, or for example from 90 mol % to 120 mol %.

(Mixing step) The cleaning agent manufacturing method may comprise a mixing step in which an aqueous medium is added to a cleaning agent containing the above sulfonic acid group-containing polymer. In one example of the mixing step, a pipe supplying the cleaning agent and a pipe supplying the aqueous medium are merged in the middle to mix the two, and this mixed cleaning agent is then supplied to a surface to be cleaned. A common method may be used for this mixing, such as a method of collision mixing the liquids together through a narrow passage under pressure, a method of packing a pipe with a filling such as glass tubes to repeatedly separate and then merge the liquid flows, or a method using blades that rotate under power in the pipe.

In another method, for example a pipe for supplying the cleaning agent and a pipe for supplying the aqueous medium are provided independently, and predetermined amounts of each liquid are supplied from the respective pipes to the surface to be cleaned and mixed on the surface to be cleaned. Alternatively, for example predetermined amounts of the cleaning agent and aqueous medium can be placed together and mixed in one container, and the mixed cleaning agent can then be supplied to the surface to be cleaned.

In the mixing step, the total mass amount of the aqueous medium mixed with the polymer may be for example from 4 to 1,000,000 times the amount of the polymer. This total mass amount may be for example from 50 to 100,000 times, or for example from 100 to 50,000 times, or for example from 500 to 10,000 times, or for example from 1,000 to 5,000 times. The aqueous medium may be the same as the polymerization solvent used for the sulfonic acid group-containing polymer above, but an alcohol or the like may also be added thereto as appropriate.

(Wetted Elements)

In the cleaning agent manufacturing method, it is desirable to suppress contamination of the process liquids by metal components from one or two or more wetted elements that contact one or two or more kinds of process liquids, which are liquids supplied to at least part of the polymerization step and mixing step.

Examples of process liquids in the polymerization step include the reaction medium containing the solvent and monomers for manufacturing the polymer together with additives such as a polymerization initiator, a catalyst and the like, the reaction solution during the polymerization reaction, and the reaction solution after completion of the polymerization reaction. Examples of process liquids in the mixing step include liquids containing the dissolved or dispersed cleaning agent containing the polymer, and the aqueous medium for mixing with the cleaning agent and the like.

Examples of wetted elements in the polymerization step include reaction vessels, piping members, liquid feed members, stirring members, heating members, filtration members, storage vessels and measurement instruments that have parts that are contacted by the process liquid and vaporized process liquid in the polymerization step described above. Examples of wetted elements in the mixing step include reaction vessels, piping members, liquid feed members, stirring members, heating members, filtration members, storage vessels and measurement instruments that have parts that are contacted by the process liquid and vaporized process liquid in the mixing step described above.

In the cleaning agent manufacturing method, the contents of the specific kinds of metals described above can be suppressed at or below a predetermined content by suppressing contamination of the process liquid by metal components from such wetted elements. The following embodiments may be adopted for such suppression.

For example, a wetted element may be (a) a metal member provided with a metal component elution-resistant material on the wetted surface or (b) a member consisting primarily of such a metal component elution-resistant material. The embodiment (a) is not particularly limited, but for example the metal component elution-resistant material may take the form of a coating or lining on the surface of the wetted element that contacts the process liquid. For the embodiment (b), a part or all of the wetted element may be composed primarily of the metal component elution-resistant material.

To be composed primarily of a metal component elution-resistant material may mean that the material constitutes at least 50 mass %, or preferably at least 60 mass %, or more preferably at least 70 mass %, or still more preferably at least 80 mass %, or yet more preferably at least 90 mass %, or even more preferably at least 95 mass %, or especially at least 99 mass %, or most preferably 100 mass % of the whole.

Examples of metal component elution-resistant materials here include materials fulfilling the following conditions for example. That is, when 80 g of dilute sulfuric acid with a concentration of 5 g/L is heated for 1 hour at 80° C. in contact with a 200 $cm^2$ contact area, the increase in each of Na, Al, K, Ca and Fe in the dilute surface acid is not more than 1 ppm. Dilute sulfuric acid is a non-oxidizing acid, and it is thought that if the increase in each metal element is not more than 1 ppm under conditions of 1 hour at 80° C., this means that elution of metal elements has been thoroughly suppressed in the polymer manufacturing process.

The concentrations of the metal elements in the dilute sulfuric acid may be measured by ICP emission spectrometry (high-frequency inductively coupled plasma emission spectroscopy) or ICP mass spectrometry (high-frequency inductively coupled plasma mass spectrometry). Typical measurement methods are disclosed in the examples.

Preferably the metal component elution-resistant material itself either does not intrinsically contain metals with higher ionization tendencies than hydrogen (such as K, Ca, Na, Mg, Al, Zn, Fe, Ni, Sn and Pb), or contains not more than about 10 mass % of any individual metal element. In the non-oxidizing acid, preferably these metal elements ae not more than 1.0 mass %, or more preferably not more than 0.1 mass %, or still more preferably not more than 0.01 mass %. The reason for this is that since metals with higher ionization tendencies than hydrogen tend to be oxidized, these metals may be eluted if they are contained in the wetted element.

Examples of such metal component elution-resistant materials include fluorine resins (polytetrafluoroethylene (PTFE), perfluoroalkoxy alkane (PFA), fluorinated ethylene propylene copolymer (FEP), ethylene tetrafluoroethylene copolymer (ETFE), polyvinylidene fluoride (PVDF), polyvinyl fluoride (PVF), ethylene-chlorotrifluoroethylene copolymer (ECTFE), etc.), polyolefin resins (polyethylene, etc.), tantalum and the like.

Whether or not the metal component elution-resistant material is one of the above materials, it may for example be a material in which metal elution due to repeated use and cleaning has been reduced, or a material that undergoes passivation of the contact parts in contact with the process liquid or the like.

In the cleaning agent manufacturing method, the amount of metal element or ions of at least one kind of metal selected from the group consisting of Na, Al, K, Ca and Fe is for example not more than 2 ppm in a process liquid containing the polymer. That is, if the content of these metal components is not more than 2 ppm in a process liquid containing the polymer, the adverse effects of metal ions can be suppressed when using the manufactured cleaning agent. The process liquid containing the polymer may be for example a reaction solution after completion of polymerization or a solution containing the cleaning agent or the like.

The content of the metal element or metal ions is for example not more than 1.5 ppm, or for example not more than 1.0 ppm, or for example not more than 0.5 ppm, or for example not more than 0.1 ppm, or for example not more than 0.05 ppm.

The metal element or metal ions in the process liquid may be measured by a method for measuring metal elements in dilute sulfuric acid or the like.

Cleaning Method>

This Description provides a cleaning method for cleaning semiconductor components using the cleaning agent. In the process of manufacturing semiconductor components, the cleaning agent may be used for example in cleaning steps before and after CMP, before and after chemical vapor deposition (CVD), after resist development, after dry etching, after wet etching, after dry ashing and after resist peeling and the like. Of these, cleaning after CMP is desirable for controlling the content of metal impurities. A component composed of the materials described above may be used as the semiconductor component to be cleaned.

A known cleaning method commonly used in the semiconductor field may be applied as the cleaning method for cleaning the semiconductor component to be cleaned with the cleaning agent, and examples include dip methods in which the semiconductor component to be cleaned is dipped in a cleaning tank filled with the cleaning agent, spin methods in which the semiconductor component to be cleaned is rotated at high speed as the cleaning agent is dropped from a nozzle located above the semiconductor component to be cleaned, and spray methods in which the cleaning agent is sprayed to clean the semiconductor component to be cleaned. Examples of the apparatus used to implement these methods include batch cleaning units for simultaneously cleaning multiple sheets of semiconductor components enclosed in a cassette, and single-wafer cleaning units for cleaning single semiconductor components mounted on a holder.

The cleaning step may also be implemented on a polishing plate by supplying the cleaning agent with the semiconductor component to be cleaned still attached to the polishing pad after polishing. In this case, not only does the polishing pad physically wipe foreign matter off the surface to be cleaned, but impurities on the surface are also reduced by the chemical cleaning effect of the cleaning agent. The cleaning step may also be implemented by removing the semiconductor component from the polishing plate after polishing, and then supplying the cleaning agent to the semiconductor component (without using the polishing pad). In this case, impurities on the surface to be cleaned are reduced by the mechanical effect of supplying the cleaning agent as a spray or the like and the chemical cleaning effect of the cleaning agent itself. When no polishing pad is used, a physical cleaning operation using a cloth or brush may also be included.

When cleaning the semiconductor component to be cleaned, the time during which the cleaning agent is in contact with the semiconductor component to be cleaned may be selected appropriately according to the cleaning method and is for example from 0.5 minutes to 1 hour, or for example from 1 minute to 30 minutes, or for example from 1 minute to 15 minutes when using a batch cleaning unit. When using a single-wafer cleaning unit, the time may be for example from 1 second to 15 minutes, or for example from 5 seconds to 10 minutes, or for example from 5 seconds to 5 minutes.

Semiconductor Component Manufacturing Method>

The semiconductor component manufacturing method disclosed in this Description may comprise a cleaning step in which the cleaning agent is used to clean the surface of a semiconductor component to be cleaned. A component composed of the various materials described above may be used as the semiconductor component to be cleaned. The cleaning method in the cleaning step of this manufacturing method may be similar to the cleaning methods described above.

In the manufacturing method, residual foreign matter such as abrasive grains and abrasive residue on the surface of a component after CMP are reduced and problems caused by residual foreign matter in subsequent steps are prevented by using the cleaning agent described in this Description to clean a semiconductor component to be cleaned. Because the cleaning agent has a low content of specific metals, moreover, few metal impurities remain on the semiconductor component after cleaning. A highly reliable semiconductor component can thus be manufactured by this manufacturing method. This is also desirable for reducing environmental load because the amount of chemicals used in the cleaning process can be significantly reduced.

EXAMPLES

The disclosures of this Description are explained in detail below using specific examples. However, the disclosures of this Description are not limited by these specific examples. Unless otherwise specified, "parts" in the descriptions below refer and to mass parts and "%" values are mass % values.

(Manufacturing Example 1) 99 g of 2-acrylamido-2-methylpropane sulfonic acid (ATBS) and 1 g of acrylic acid (ATBS: acrylic acid mass ratio 99:1) as monomers for manufacturing the sulfonic acid group-containing polymer were placed together with 180 g of pure water in a high purity polyethylene container, and stirred to dissolve at room temperature to prepare a sample of Manufacturing Example 1 (hereinafter also called a monomer solution of Manufacturing Example 1). The metal elements in this monomer solution were then measured immediately.

The metal elements were measured with an ICP emission spectrometer and an ICP mass spectrometer. The specific measurement conditions were as follows.

(1) 1 g of the liquid to be measured was diluted with 20 g of ultrapure water, and 1 ml of nitric acid (Ultrapur-100 ultra-high purity reagent by Kanto Chemical Co., Inc.) was added to obtain a measurement sample.

(2) The amounts of metal elements in the measurement sample were measured with an ICP emission spectrometer (Spectro Arcos SOP) and an ICP mass spectrometer (Agilent 7700s).

(3) The measurement values from ICP emission spectrometry were adopted for metal elements having a metal component measurement value of at least 1 ppm in ICP emission spectrometry. For metal components for which the measured value was less than 1 ppm, the measurement values from 1CP mass spectrometry were adopted.

(Example 1) When evaluating by the following metal elutability evaluation method, 180 g of pure water was placed in a glass reaction vessel (with a tantalum thermocouple placed inside) that was confirmed to be a metal component elution resistant material, and the water was heated to 80° C. and maintained at 80° C. as 280 g of the monomer solution of Manufacturing Example 1 and an ammonium persulfate solution (2 g of ammonium persulfate (APS) dissolved in 30 g of water) was added with a metering pump over the course of 4 hours to perform a polymerization reaction. After the polymerization reaction the polymer solution was immediately stored in a high-purity polyethylene container, and the metal element concentration in the polymer solution was measured with the results shown in Table 1.

(Method for evaluating metal elutability of wetted element) 80 g of dilute sulfuric acid with a concentration of 5 g/L was brought into contact with the wetted element with a contact area of 200 cm$^2$ and heated at 80° C. for 1 hour, and when the increase in each of the elements Na, Al, K, Ca and Fe in the dilute sulfuric acid was not more than 1 ppm, the vessel was judged to be metal elution resistant, while when the increase was more than 1 ppm, it was judged to be metal component elutable. The concentrations of the metal components were measured with an ICP emission spectrometer and an ICP mass spectrometer.

(Examples 2 to 6 and Comparative Examples 1 and 2) These examples were treated as described below, with the results shown in Table 1.

(Example 2) The operations were the same as in Example 1 except that the reaction vessel was made of PFA resin (with no tantalum thermocouple).

(Example 3) The operations were the same as in Example 1 except that the reaction vessel was an SUS304 vessel (with no tantalum thermocouple) surface coated with ETFE resin.

(Example 4) The operations were the same as in Example 1 except that the monomer solution prepared in the Manufacturing Example 1 was first neutralized with ammonia water (120 mol % relative to ATBS) and then polymerized in an SUS304 vessel (with no tantalum thermocouple).

(Example 5) 180 g of pure water was placed in a PFA resin reaction vessel (with no tantalum thermocouple) and heated to 70° C., and 280 g of the monomer solution prepared in Test Example 1 and an aqueous solution of 4 g of 2,2'-azobis [2-(2-imidazolin-2-yl) propane] disulfate dihydrate (VA-046B) dissolved in 30 g of water was added with a metering pump over the course of 4 hours to perform a polymerization reaction, with the other operations being the same as in Example 1.

(Example 6) 425 g of pure water were placed in an SUS304 vessel (with no tantalum thermocouple) surface coated with ETFE resin and heated to 90° C., and the temperature was then maintained at 90° C. as a monomer solution of 70 g of ASTB and 30 g of acrylic acid dissolved in 425 g of pure water and an ammonium persulfate solution of 3.5 g of ammonium persulfate dissolved in 30 g of pure water were immediately added with a metering pump over the course of 4 hours to perform a polymerization reaction, with the other operations being the same as in Example 1.

(Example 7) A monomer solution of 70 g of ASTB and 30 g of acrylic acid dissolved in 405 g of pure water was placed together with 0.1 g of ammonium persulfate and 2.0 g of 3-((((1-carboxyethyl)thio)carbonothioyl)thio) propanoic acid (CESPA, RAFT agent) in a SUS304 vessel (with no tantalum thermocouple) surface coated with ETFE resin, heated to 70° C., and maintained for 4 hours at 70° C. to perform a polymerization reaction, with the other operations being the same as in Example 1.

(Comparative Example 1) The operations were the same as in Example 1 except that 180 g of pure water was used in a borosilicate glass vessel (with a SUS304 thermocouple and a baffle plate installed inside).

(Comparative Example 2) The operations were the same as in Comparative Example 1 except that the polymerization initiator was changed to 2 g of sodium persulfate.

easily reduced by using materials designed to suppress elution of metal components into the process liquid from wetting elements that are wetted by the reaction solution and other process liquids.

(Evaluation 1 of residual metal components after cleaning) A mirror polished silicon wafer (2 cm×2 cm) was immersed for 1 hour in 50 g of the polymer solution (cleaning agent) of Example 1 and blown with nitrogen, and residual Na element on the silicon wafer was analyzed by fluorescence X-ray (TREX630III, detection limit $5.0 \times 10^{12}$/ $cm^2$, by Teknos). The evaluation result was "A" if the element was indetectable (not more than the detection limit). The cleaning agents of Examples 2 to 7 and Comparative Examples 1 and 2 were also subjected to the same operations as the cleaning agent of Example 1, with the results shown in Table 1.

(Evaluation 2 of residual metal components after cleaning) A mirror polished silicon wafer (6-inch) was immersed for 3 minutes in a mixture of 3% sodium hydroxide, 3% potassium hydroxide, 3% iron (III) hydroxide, 3% calcium hydroxide and 3% aluminum hydroxide, and lightly washed with water to contaminate the wafer. The amount of each metal element on the surface of the contaminated silicon wafer was measured by vapor phase decomposition-inductively coupled plasma mass spectrometry (VPD-ICPMS). A

TABLE 1

| | Initiator | RAFT agent | Wetted member | $NH_3$ neutral-ization Y/N | Element [ppm] | | | | | | | | | | Residual Na [number per $cm^2$] |
|---|---|---|---|---|---|---|---|---|---|---|---|---|---|---|---|
| | | | | | Na | Al | K | Ca | Fe | Mg | Cr | Ni | Zn | Ta | |
| Manufacturing Example 1 | — | — | High-purity PE | N | 0.02 | <0.01 | <0.01 | 0.06 | 0.28 | <0.01 | 0.02 | <0.01 | <0.01 | <0.01 | — |
| Example 1 | APS | — | Low-elution glass, $T_a$ | N | 0.18 | <0.01 | 0.02 | 0.08 | 0.24 | 0.02 | 0.02 | <0.01 | 0.02 | <0.01 | A |
| Example 2 | APS | — | PFA resin | N | 0.04 | <0.01 | 0.08 | 0.08 | 0.24 | <0.01 | 0.04 | <0.01 | 0.02 | <0.01 | A |
| Example 3 | APS | — | ETFE lining | N | 0.04 | <0.01 | 0.02 | 0.06 | 0.12 | <0.01 | 0.02 | <0.01 | <0.01 | <0.01 | A |
| Example 4 | APS | — | SUS304 | Y | 0.38 | 0.02 | 0.10 | 0.22 | 0.22 | 0.02 | 0.06 | 0.02 | 0.04 | <0.01 | A |
| Example 5 | VA-046B | — | PFA resin | N | 0.02 | <0.01 | <0.01 | 0.02 | 0.10 | <0.01 | <0.01 | <0.01 | <0.01 | <0.01 | A |
| Example 6 | APS | — | ETFE lining | N | 0.06 | <0.01 | 0.02 | 0.03 | 0.08 | <0.01 | 0.01 | <0.01 | <0.01 | <0.01 | A |
| Example 7 | APS | CESPA | ETFE lining | N | 0.05 | <0.01 | 0.03 | 0.04 | 0.10 | <0.01 | 0.02 | <0.01 | <0.01 | <0.01 | A |
| Comparative Example 1 | APS | — | Borosilicate glass, SUS304 | N | 4.7 | 1.2 | 0.86 | 0.76 | 0.88 | 0.02 | 0.16 | 0.02 | 0.12 | <0.01 | $5 \times 10^{13}$ |
| Comparative Example 2 | NPS | — | Borosilicate glass, SUS304 | N | 1750 | 1.5 | 1.7 | 1.1 | 0.88 | 0.06 | 0.16 | 0.02 | 0.16 | <0.01 | $2 \times 10^{16}$ |

As shown in Table 1, to obtain a copolymer having a sulfonic acid group-containing structural unit in which the contents of Na, Al, K, Ca and Fe and the contents of Mg, Cr, Ni, Zn and Ta are at or below a certain level, it is important that the wetted elements such as the reaction vessel be formed from materials that are resistant to metal component elution. It has also been found that the initiator used for polymerization should contain as little metal as possible. It has also been found that elution of metal components from stainless steel is suppressed when the degree of neutralization of the sulfonic acid groups is 120 mol %.

Thus, it has been shown that the metal concentration in a process liquid containing a polymer can be effectively and 2% aqueous solution of the polymer of Example 1 was then prepared as a cleaning solution, and the contaminated silicon wafer was cleaned at 25° C. for 3 minutes in this cleaning solution and water washed and dried, and the amounts of the metal elements on the silicon wafer surface were measured again. The polymers of Examples 2 to 7 and Comparative Examples 1 and 2 were also subjected to the same operations as the polymer of Example 1. As a reference example, a contaminated silicon wafer was also cleaned and dried as above using distilled water instead of the cleaning solution, and the amounts of the metal elements on the silicon wafer surface were measured. The results are shown in Table 2.

TABLE 2

| | Na | Al | K | Ca | Fe | Mg | Cr | Ni | Zn |
|---|---|---|---|---|---|---|---|---|---|
| Residual amount [number per $cm^2$] | $\times 10^{12}$ | $\times 10^{13}$ | $\times 10^{12}$ | $\times 10^{13}$ | $\times 10^{13}$ | $\times 10^{13}$ | $\times 10^{12}$ | $\times 10^{12}$ | $\times 10^{12}$ |

TABLE 2-continued

|  | Na | Al | K | Ca | Fe | Mg | Cr | Ni | Zn |
|---|---|---|---|---|---|---|---|---|---|
| Example 1 | 0 | 0 | 0 | 0 | 0 | 0 | 0 | 0 | 0 |
| Example 2 | 0 | 0 | 0 | 0 | 0 | 0 | 0 | 0 | 0 |
| Example 3 | 0 | 0 | 0 | 0 | 0 | 0 | 0 | 0 | 0 |
| Example 4 | 0 | 2 | 0 | 0 | 1 | 0 | 0 | 0 | 0 |
| Example 5 | 0 | 0 | 0 | 0 | 0 | 0 | 0 | 0 | 0 |
| Example 6 | 0 | 0 | 0 | 0 | 0 | 0 | 0 | 0 | 0 |
| Example 7 | 0 | 0 | 0 | 0 | 0 | 0 | 0 | 0 | 0 |
| Comparative Example 1 | 1 | 0 | 0 | 0 | 6 | 0 | 0 | 0 | 1 |
| Comparative Example 2 | 18 | 0 | 0 | 0 | 3 | 0 | 0 | 0 | 0 |
| Reference Example (water washing) | 9 | 6 | 4 | 5 | 240 | 7 | 1 | 2 | 20 |

As shown in Tables 1 and 2, good detection results were obtained when silicon wafers were immersed in the cleaning agents of Examples 1 to 7 having a small content of Na and Fe elements. This shows that the amount of metal residue on a silicon wafer to be cleaned can be reduced after cleaning by keeping the metal content in the cleaning agent itself at or below a certain content. When silicon wafers were immersed in the cleaning agents of Comparative Examples 1 and 2, on the other hand, large amounts of Na and Fe element remained on the silicon wafer surface. This is attributed to the fact that metal components derived from the cleaning agent remained because the cleaning agent itself contained large quantities of Na and Fe element.

As shown in Comparative Example 2 and the reference example in Table 2, moreover, the silicon wafer cleaning effect with the cleaning agent was confirmed to be less than with water containing no cleaning agent depending on the metal element concentration of the cleaning agent. This shows that the amount of metal components contained in the cleaning agent itself greatly affects the amount of residual metal impurities on the surface of the semiconductor component after cleaning. That is, this shows that metal components on semiconductor components after cleaning can be favorably reduced when using the cleaning agents of Examples 1 to 7 to clean semiconductor components.

Thus, it was found that cleaning semiconductor components with a cleaning solution having a reduced content of metal contaminants is important for obtaining clean semiconductor components. It was also found that using a cleaning agent with a reduced content of Na, Al, K, Ca and Fe obtained using a wetted element made of a material with reduced metal component elutability as a wetted element in the manufacturing process is an easy and efficient method for obtaining clean semiconductor components because it is thus possible to reliably avoid unintended contamination and re-cleaning without the need for a removal step to remove metal ions with an ion-exchange resin.

The invention claimed is:

1. A semiconductor component cleaning agent, comprising:
    a sulfonic acid group-containing polymer in an amount of 0.1% by mass or more and 40% by mass or less,
    wherein the sulfonic acid group-containing polymer has a structural unit derived from a (meth)acrylamide-2-methylpropane sulfonic acid or a salt thereof, and
    wherein a content of at least one kind of metal selected from the group consisting of Na, Al, K, Ca and Fe is not more than 0.7 ppm.

2. The semiconductor component cleaning agent according to claim 1, wherein the at least one kind of metal includes Na and the content of Na is not more than 0.1 ppm.

3. The semiconductor component cleaning agent according to claim 2, wherein the at least one kind of metal further includes Fe and the content of Fe is not more than 0.3 ppm.

4. The semiconductor component cleaning agent according to claim 3, wherein the at least one kind of metal further includes Ca and the content of Ca is not more than 0.1 ppm.

5. The semiconductor component cleaning agent according to claim 4, wherein the at least one kind of metal further includes K and the content of K is not more than 0.1 ppm.

6. The semiconductor component cleaning agent according to claim 5, wherein the at least one kind of metal further includes Al and the content of Al is not more than 0.1 ppm.

7. The semiconductor component cleaning agent according to claim 1, wherein the (meth)acrylamide-2-methylpropane sulfonic acid is 2-acrylamido-2-methylpropane sulfonic acid or a salt thereof.

8. The semiconductor component cleaning agent according to claim 7, wherein the structural unit derived from 2-acrylamido-2-methylpropane sulfonic acid or a salt thereof constitutes at least 0 mass % and not more than 100 mass % of total structural units of the sulfonic acid group-containing polymer.

9. The semiconductor component cleaning agent according to claim 1, wherein a structural unit derived from a carboxy group-containing monomer constitutes at least 0 mass % and not more than 30 mass % of total structural units of the sulfonic acid group-containing polymer.

10. The semiconductor component cleaning agent according to claim 1, which is a cleaning agent for a cleaning semiconductor component after polishing.

11. The semiconductor component cleaning agent according to claim 1, wherein the sulfonic acid group-containing polymer is in an amount of 1.0% by mass or more and 30% by mass or less and the content of Na is not more than 0.1 ppm.

12. The semiconductor component cleaning agent according to claim 11, wherein the content of Fe is not more than 0.3 ppm.

13. The semiconductor component cleaning agent according to claim 12, wherein the content of Ca is not more than 0.1 ppm.

14. The semiconductor component cleaning agent according to claim 13, wherein the content of K is not more than 0.1 ppm.

15. The semiconductor component cleaning agent according to claim 14, wherein the content of Al is not more than 0.1 ppm.

16. The semiconductor component cleaning agent according to claim 1, wherein the sulfonic acid group-containing polymer is in an amount of 1.0% by mass or more and 30% by mass or less and the content of Na is not more than 0.1 ppm.

\* \* \* \* \*